United States Patent [19]

Baba

[11] Patent Number: 4,709,407
[45] Date of Patent: Nov. 24, 1987

[54] BAND DISCRIMINATING METHOD IN A RECEIVER

[75] Inventor: Yoshihiko Baba, Noda, Japan

[73] Assignee: Uniden Corporation, Ichikawa, Japan

[21] Appl. No.: 782,566

[22] Filed: Oct. 1, 1985

[30] Foreign Application Priority Data

Nov. 5, 1984 [JP] Japan .................................. 59-231288

[51] Int. Cl.$^4$ ........................ H04B 17/00; H04B 1/26
[52] U.S. Cl. .................................... 455/226; 455/228;
455/315; 342/20
[58] Field of Search ...................... 324/85; 342/20, 27;
455/226, 161, 228, 214, 207–209, 313–316, 168,
145–148

[56] References Cited

U.S. PATENT DOCUMENTS

| 2,977,465 | 3/1961 | Sanders et al. | 455/146 |
| 3,154,741 | 10/1964 | Attwood | 324/85 |
| 4,313,216 | 1/1982 | Jaeger et al. | 342/20 |
| 4,581,769 | 4/1986 | Grimsley et al. | 342/20 |
| 4,626,857 | 12/1986 | Imazeki | 342/20 |

Primary Examiner—Robert L. Griffin
Assistant Examiner—Melvin C. Marcelo
Attorney, Agent, or Firm—Oblon, Fisher, Spivak, McClelland, & Maier

[57] ABSTRACT

A band determining method in which radar signals of first and second frequency bands are received in the upper- and lower-heterodyne reception modes, using a local oscillation signal modulated with a low frequency signal, thus causing the phase relationship between the detected signal and the modulating signal to indicate which band signals are received.

3 Claims, 6 Drawing Figures

FIG_3(A)
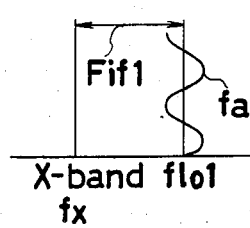
Upper Heterodyne
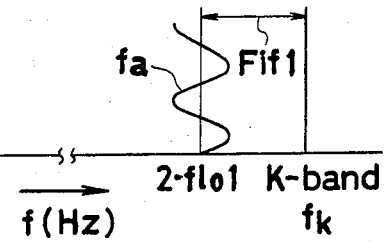
Lower Heterodyne
FIG_3(B)
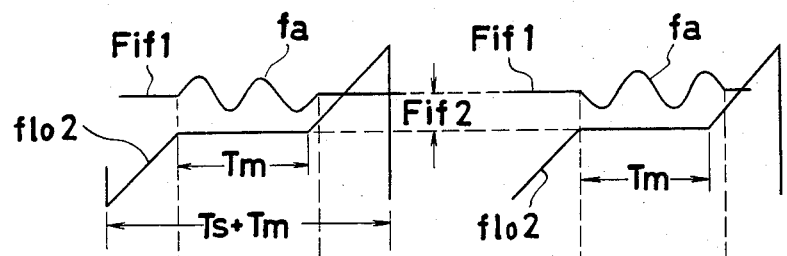
FIG_3(C)
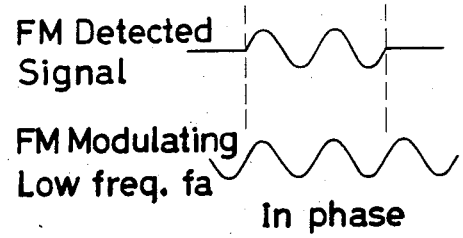
In phase      Opposite phase

BAND DISCRIMINATING METHOD IN A RECEIVER

FIELD OF THE INVENTION AND RELATED ART STATEMENT

The present invention relates to a band discriminating method for use in a receiving set such as a radar detector adopting the X- and K-bands, and particularly to a method for discriminating which frequency band the frequency of signals received by such a receiving set belong to.

In many instances, radar detectors are designed to receive radar signals of two different bands in the microwave range. One of these bands is called the X-band (10.525 GHz±100 MHz) and the other is called the K-band having a frequency about twice as high as that of the X-band (24.150 GHz±100 MHz).

In an attempt to simplify the structure of the receiving set of this type and reduce cost to the minimum possible, a harmonic mixing circuit is used in the mixing stage of the receiver for permitting a local oscillator to apply a fundamental harmonic wave and a second harmonic wave to the harmonic mixing circuit, thereby outputting the intermediate signal having a fixed frequency irrespective of the band. As mentioned above, the K-band basically utilizes a frequency range approximately twice that of the X-band. However, the frequency of the K-band is not exactly twice that of the X-band. Therefore, different local oscillation frequency ranges are generally used for the K- and X-bands in the heterodyne system, i.e., an "upper heterodyne" is used for the X-band and a "lower heterodyne" is used for the K-band.

The conventional radar detector using a harmonic mixing circuit as just described need not be equipped with separate components for the respective bands, and accordingly it is advantageous in that the structure of the whole system and hence the overall cost are substantially reduced. However, the respective intermediate signals for the X-band and K-band to which the received signals are selectively converted have a fixed frequency as mentioned above and therefore, no longer contain band identifying information so that the band of the received signal cannot be discriminated.

Assume that the aforementioned conventional radar detector is used for detecting a radar wave in measuring the speed of a moving object. Ordinarily, the frequency of the radar wave signal radiated by the speed measuring radar belongs to the K-band. In fact, the K-band is used almost exclusively for the purpose of measuring the speed of moving objects.

In contrast, the X-band is often used for remote control systems. For instance, the X-band is used for opening and closing garage doors etc. from a remote place and a variety of other such applications.

As will be understood from the above, the conventional radar detector cannot selectively detect solely a speed measuring radar signal from the other signals. This is because it detects not only the desired signals in the K-band, but also the undesired pseudo-radar signals of the K-band, presenting one and the same display when detecting either of the bands. Thus, the radar detector is unreliable for such purpose.

If the radar detector should be capable of identifying which band signals are received, its usefulness and reliability would be enhanced. As for the above described example, if the detector should be capable of selectively detecting K-band signals, speed-measuring radar signals could be detected at the accuracy rate of almost one hundred percent because the K-band signal is radiated exclusively by speed-measuring radar. In an attempt to meet the demand for identification of X- and K-bands a few radar detectors have been hitherto proposed. These radar detectors, however, require parts specially designed for microwave use, relying on very complicated signal processing. Therefore, the advantage of simplifying the circuit structure thanks to the use of a harmonic mixing circuit is lost.

OBJECT AND SUMMARY OF THE INVENTION

The object of the present invention is to provide a method for identifying the band of the received signals with the aid of a simple circuit in a most reliable way.

To attain this object according to the present invention there is provided a method of discriminating between first and second frequency bands within which first and second signals having different frequency regions, one referred to as the upper-heterodyne region and the other as the lower-heterodyne region, fall and are respectively converted to one intermediate signal of a fixed frequency in a harmonic mixing circuit, which comprises the steps of frequency-modulating a local oscillation signal with a low frequency signal to produce the intermediate frequency signal; detecting the intermediate frequency signal thus produced, obtaining the phase relation between the detected signals appearing at reception of first band signals and the low frequency modulating signal and the phase relation between the detected signals appearing at reception of second band signals and the low frequency modulating signal; and making a decision as to which band signal is being received on the basis of the difference between the phase relations.

In a receiving system in which two band signals, such as X-band and K-band signals, which have a relationship that one of the signals falls in the upper heterodyne region and the other falls in the lower heterodyne region with respect to the fundamental wave and a harmonic wave of the local oscillating signal by means of one harmonic mixing circuit are converted to the same intermediate frequency signal of a fixed frequency, if the local oscillating signal is frequency-modulated with a low frequency signal, the detected intermediate frequency signal of one of the band signals relative to the low frequency signal is different in phase from that of the other band signal.

For instance, in a radar detector adopting the X- and K-bands, when the local oscillating signals are modulated with a low frequency modulating signal, the FM signals outputted from the FM detecting circuit and the low frequency modulating signals are brought into the same phase relation in case of receiving the X-band radar signals having the upper-heterodyne frequency, whereas the detected signals and the low frequency modulating signals are brought into the opposite phase relation in case of receiving the K-band radar signals having the lower heterodyne frequency.

Thus, a decision as to which the X- or K-band the received signals fall in can be made easily by using a known phase comparator which is simple in construction and inexpensive.

As may be understood from the principle of the present invention just described, the signal with which the local oscillating signals are to be modulated may be of as low frequency and amplitude as can be easily handled, requiring no special parts like those required for microwave use. It suffices that such a low frequency modulating signal be applied to a bias voltage source used for the local oscillating circuit.

BRIEF DESCRIPTION OF THE DRAWINGS

FIG. 3(A) to 3(C) show diagrammatically how the received signals are identified in terms of their frequency bands.

DETAILED DESCRIPTION OF THE PREFERRED EMBODIMENTS

Figure 1:
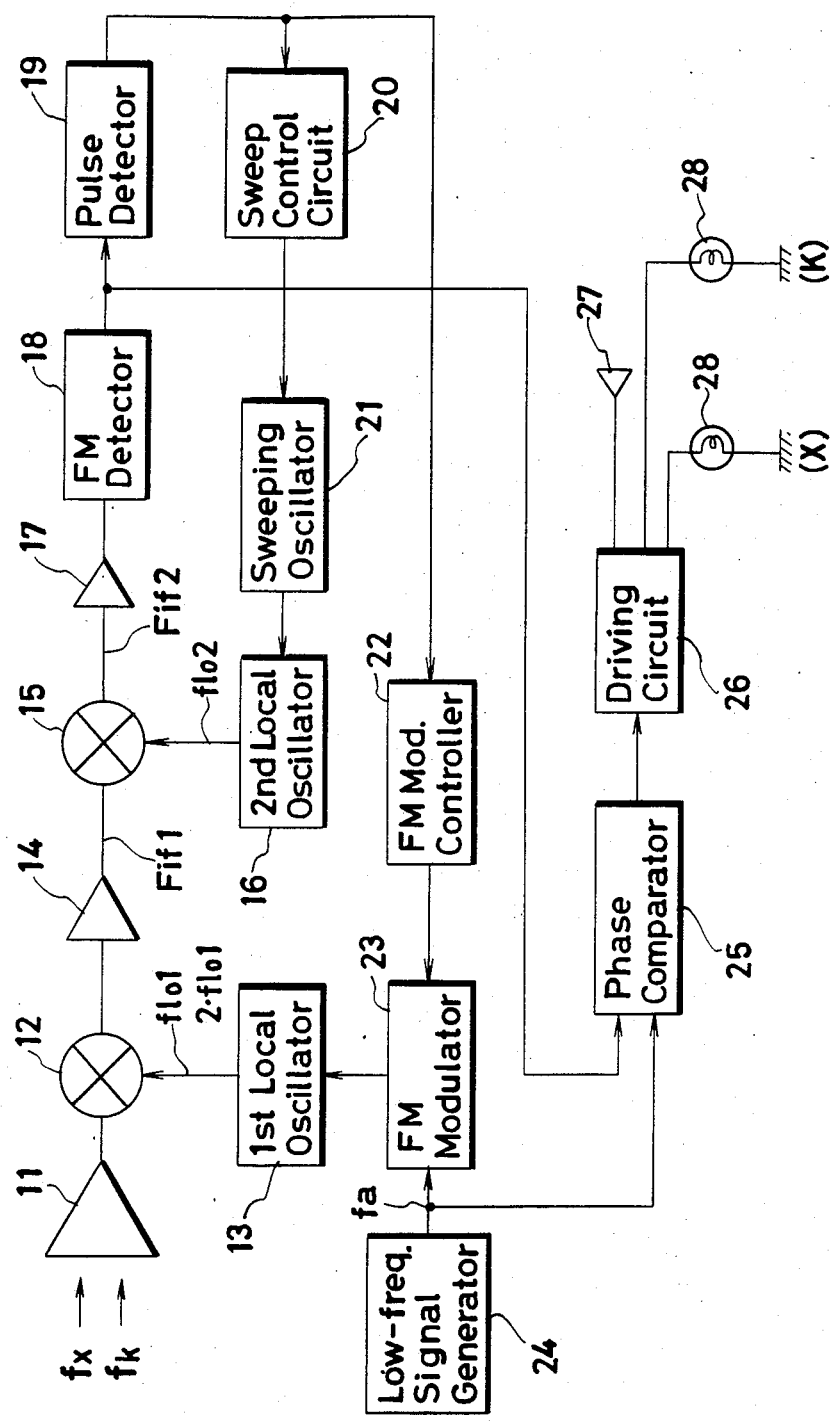
FIG. 1 is a block diagram illustrating the principle of the band discriminating method of the present invention.

FIG. 1 shows a block diagram of a radar detector designed to detect the X- and K-band radar signals according to the principle of the present invention.

The radar detector shown herein adopts a double-heterodyne system in which the X-band radar signals fx and the K-band radar signals fk received by an antenna 11 are directed to a harmonic mixer 12 so that they are mixed with the fundamental frequency flo1 and the second harmonic 2·flo1 of the first local oscillator 13, thus deriving the first intermediate frequency (IF) beat signal Fif1 from the first IF circuit 14.

As is known, of the beat signals derived from the first IF circuit 14, one beat signal having the X-band frequency falls in the upper-heterodyne region and the other beat signal having the K-band frequency falls in the upper-heterodyne region. This can be mathematically expressed as follows:

$$flo1 - fx = Fif1 = fk - 2 \cdot flo1 \qquad (1)$$

The first IF signal Fif1 is converted to the second IF signal FiF2 by means of a second mixer 15. For this purpose the second local oscillator 16 sweeps its oscillating frequency repeatedly at the period of Ts over a predetermined frequency range for each radar band, that is, 0 to 100 MHz in this particular example.

A voltage-controlled oscillator may be advantageously used as the second local oscillator 16, and in this case the frequency sweep may be controlled by the voltage signal from an associated sweeping oscillator 21.

Figure 2:
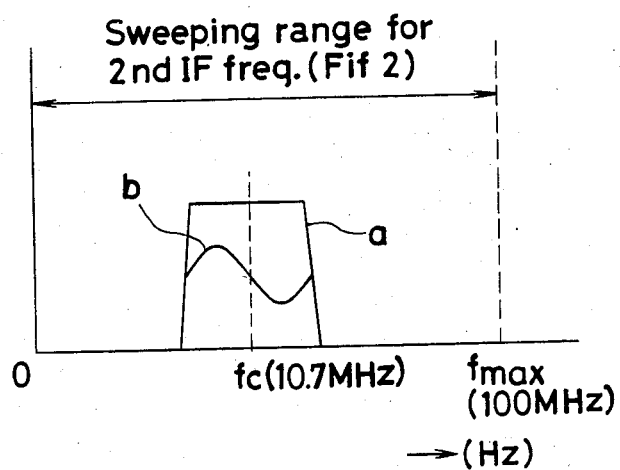
FIGS. 2(A) and 2(B) show the band-pass characteristics of a filter for use in processing the second intermediate frequency signals.
Figure 2:
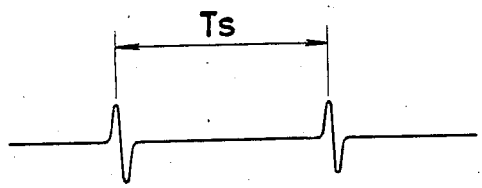

With this arrangement the first IF signal is mixed with the local oscillating and frequency-sweeping signal flo2 in the second mixer 15 so that it is converted to the second IF signal Fif2, which is directed to a band-pass filter stage comprising a band-pass filter 17 and an FM detector 18. The center frequency fc of the band-pass filter stage is, for instance, 10.7 MHz. As shown in FIG. 2(A), the characteristics of the band-pass filter stage are a composite of the band-pass characteristics a of the filter 17 and the "S"-curve characteristics b of the FM detector 18. Assuming that the radar detector has no capability of temporarily stopping the frequency sweep (although it does as will be described later), the frequency sweeping signal can be detected in the form of pulse signals, outputting from the FM detector 18 in each sweeping period Ts, as shown in FIG. 2(B).

The length of time, however, is so short that it is difficult to detect the presence of a desired radar signal from among the noise. In an attempt to reduce this difficulty, use is made of a pulse detector 19 and a sweep control circuit 20 in combination. The pulse detector is adapted to detect pulse signals outputted from the FM detector 18, and the sweep control circuit 20 is responsive to the detection of pulse signals for holding the second local oscillator 16 at the fixed value of oscillating frequency of that instant, thus making the second local oscillator 16 stop its frequency sweep for a fixed length of time Tm.

On the other hand an FM modulator controller 22 is brought in operation in response to the output signal from the pulse detector 19, thus allowing an FM modulator 23 to apply a frequency modulation to the first local frequency signal flo1 with a low frequency signal fa, which is provided by a low-frequency signal generator 24. This is equivalent to application of the frequency modulation to the received radar signals, and the modulated components of the X-band and K-band radar signals outputted from the harmonic mixer are in opposite phase.

FIGS. 3(A) to 3(C) show diagramatically the relationship between the modulated components of the X- and K-band radar signals.

As earlier described, the X-band radar signal fx falls in the upper heterodyne region relative to the fundamental frequency flo1 from the local oscillator 13 (see FIG. 3(A), left), whereas the K-band radar signal fk falls in the lower heterodyne region relative to the second harmonic frequency 2·flo1 (see FIG. 3(A), right).

In this connection, even though the modulating waves fa are laid on the fundamental and second harmonic components of the local oscillation frequency in the same phase relationship, the opposite phase relationship is found in the modulating waves fa on the IF signal Fif1 from the harmonic mixer 12 for the length of time Tm, for which the frequency sweep stops.

Thus, a decision can be easily made as to which band radar signals are received, simply by distinguishing the respective detected signals in terms of their phases, for instance as follows.

Specifically in the embodiment just described and shown in the drawings a phase comparator 25 may be used for comparing the modulating wave of low frequency fa and the detected signal from the FM detector 18 in terms of their phases.

Specifically as shown in FIG. 3(C), in receiving the X-band radar signals fx the phase comparator 25 detects the same phase relationship between the detected signal from the FM detector 18 and the low frequency modulating signal fa, thereby providing a binary signal, that is, a logic "H" or "L" signal at the phase comparator 25. In contrast, in receiving the K-band radar signals fk the phase comparator 25 detects the opposite phase relationship between the detected signal and the low frequency modulating signal, thus providing the opposite binary signal at the phase comparator 25.

Different logic signals are thus obtained to indicate the receptions of the X- and K-band radar signals, and these different logic signals may be used selectively either to turn on light 28 or to drive conventional acoustic means 27 by driving a selectively driving circuit 26, thereby informing the operator of which band radar signals are being received.

The phase comparison of the detected signal with the low frequency modulating signal and the presentation of the result of comparison must be performed within the length of time Tm for which the frequency sweep is made to stop. If this period is inconveniently short, a timer circuit may be used for holding the signal from the phase comparator 25 for as long a time as required. Otherwise, a memory may be used for holding the signal from the phase comparator 25 until the next frequency sweep stops.

As is obvious from the above, in detecting two different radar wave signals such as the X- and K-band radar signals by converting them to one intermediate frequency signal having a fixed frequency in a single harmonic mixer in the upper- and lower-heterodyne reception modes, the band discriminating method according to the present invention permits discrimination of which band signals are received with the aid of a circuit of simple and inexpensive structure.

All that is needed is a low frequency modulating signal, requiring no expensive parts designed for microwave use. Also, the band discrimination based on the phase relationship between the detected signal and the low frequency modulating signal requires only a simple, inexpensive phase comparator well known per se, but still assuring a reliable correct band identification.

What is claimed is:

1. A method for discriminating received radar signals which belong respectively to first and second frequency bands in upper and lower-heterodyne reception modes and can be converted to the same second intermediate frequency signal in a harmonic mixing circuit, said received radar signals being discriminated between said first and second frequency bands when they are detected through said second intermediate frequency signal, which method comprises the steps of:

mixing in a first mixer the received radar signals with first local oscillating frequencies of a first fixed fundamental oscillating frequency and the second harmonic frequency being twice as high as said fundamental oscillating frequency, thereby to produce a first intermediate frequency as a heat signal;

mixing in a second mixer said first intermediate frequency with a second local oscillating frequency adapted to sweep a prescribed freqency band, thereby to produce a second intermediate frequency as a beat signal;

detecting the reception of the radar signal in accordance with said second intermediate frequency;

frequency-modulating said first local oscillating frequencies with a low frequency signal for a fixed period after said received radar signal is detected;

subjecting said second intermediate frequency to FM detection; and determining in which frequency band the received radar signal falls in accordance with the difference between the phase relationships of said FM-detected second intermediate frequency and said low frequency signal.

2. A method according to claim 1, wherein the frequency sweep of said second local oscillating frequency is made to stop for a fixed length of time on the appearance of said second intermediate frequency signal, and at the same time said first local oscillating frequencies are subjected to a frequency modulation with a low frequency signal, thereby causing said first intermediate frequency signal to have phases related with said first and second frequency bands.

3. A method according to claim 2, wherein said low frequency modulating signal and the FM-detected intermediate frequency detected signal are compared with each other in phase, and a band discriminating signal is provided on the basis of the phase relationship determined from the comparison.

* * * * *